US012683513B2

(12) United States Patent
Kashihara et al.

(10) Patent No.: US 12,683,513 B2
(45) Date of Patent: Jul. 14, 2026

(54) POWER CONVERTER

(71) Applicant: Mazda Motor Corporation, Aki-gun (JP)

(72) Inventors: Hiroaki Kashihara, Aki-gun (JP); Takayuki Sato, Aki-gun (JP); Masayuki Okazaki, Aki-gun (JP); Makoto Hattori, Higashihiroshima (JP)

(73) Assignee: Mazda Motor Corporation, Hiroshima (JP)

( * ) Notice: Subject to any disclaimer, the term of this patent is extended or adjusted under 35 U.S.C. 154(b) by 153 days.

(21) Appl. No.: 18/890,358

(22) Filed: Sep. 19, 2024

(65) Prior Publication Data

US 2025/0141362 A1 May 1, 2025

(30) Foreign Application Priority Data

Oct. 31, 2023 (JP) ................................. 2023-186218

(51) Int. Cl.
*H02M 7/00* (2006.01)
*H05K 7/14* (2006.01)

(52) U.S. Cl.
CPC ........ *H02M 7/003* (2013.01); *H05K 7/14329* (2022.08)

(58) Field of Classification Search
CPC ........................... H02M 7/003; H05K 7/14329
See application file for complete search history.

(56) References Cited

U.S. PATENT DOCUMENTS 10,522,957 B2 * 12/2019 Tanabe ................. H01R 25/162
2010/0327709 A1 12/2010 Minato et al.

2011/0261588 A1 * 10/2011 Hattori ................. F04B 39/121
363/13
2016/0327316 A1 * 11/2016 Hattori ................... H02K 5/225
2019/0252666 A1 8/2019 Watanabe et al.
2020/0195086 A1 * 6/2020 Hattori ............... H02K 11/0094
(Continued)

FOREIGN PATENT DOCUMENTS

CN 110137423 B 4/2022
EP 3930167 A1 12/2021
(Continued)

OTHER PUBLICATIONS

European Patent Office, Extended European Search Report Issued in Application No. 24206216.4, Mar. 17, 2025, Germany, 9 pages.

*Primary Examiner* — Gary A Nash

(74) *Attorney, Agent, or Firm* — Alleman Hall LLP

(57) ABSTRACT

A power converter is provided, which includes a power module part and a smoothing part including a smoothing capacitor, a cathode-side connection busbar, and an anode-side connection busbar. The smoothing capacitor has a cathode-side terminal and an anode-side terminal. One of the cathode-side connection busbar and the anode-side connection busbar has a first plate-shaped busbar and a second busbar. The second busbar connects the first busbar and the power module part. The first busbar has a terminal joining part and an extended part. The second busbar has a base part and a connection piece part connecting between the base part and the power module part. The terminal joining part and the extended part of the first busbar have a greater width and a lesser thickness than the connection piece part of the second busbar.

12 Claims, 11 Drawing Sheets

(56)          References Cited

U.S. PATENT DOCUMENTS

| | | | |
|---|---|---|---|
| 2020/0382014 A1 * | 12/2020 | Abe | H02M 7/5387 |
| 2022/0337167 A1 * | 10/2022 | Mizuno | H05K 7/14329 |
| 2022/0360164 A1 | 11/2022 | Suzuki | |
| 2023/0021288 A1 | 1/2023 | Nishimachi | |

FOREIGN PATENT DOCUMENTS

| | | | |
|---|---|---|---|
| JP | 2001345092 A | 12/2001 | |
| JP | 2014087124 A | 5/2014 | |
| JP | 2018033266 A | 3/2018 | |
| JP | 2022160271 A | 10/2022 | |

* cited by examiner

POWER CONVERTER

TECHNICAL FIELD

The present disclosure relates to a power converter.

BACKGROUND ART

In recent years, vehicles provided with a motor as a driving source for propelling the vehicles have increased. Such a vehicle carries a high-voltage battery for supplying electric power to the motor. Such a vehicle also carries a power converter for converting direct current (DC) power supplied from the battery into alternating current (AC) power.

JP2022-160271A discloses a power converter. The power converter is provided with a power module part and a smoothing part. The smoothing part is disposed at a high-voltage battery side of the power module part in an electric power circulation path, reduces a ripple voltage, and has a capacitor which smooths the electric power. The power module has a plurality of semiconductor devices, and converts DC power into AC power or converts AC power into DC power.

In this power converter, the smoothing part has six busbars which extend outwardly from a capacitor accommodating part where the capacitor is accommodated. The six busbars connect the capacitor to the power module part. Three of six busbars are connected to a cathode-side terminal of the capacitor, and the remaining three busbars are connected to an anode-side terminal of the capacitor. The six busbars are configured so that the busbars connected to the cathode-side terminal of the capacitor and the busbars connected to the anode-side terminal of the capacitor form pairs.

Meanwhile, the busbars provided to the smoothing part of the power converter are desirable to be wide and thin. This is because the busbars which connect the power module part to the capacitor are desirable to be low in inductance from the viewpoint of suppressing leakage of high-frequency noise occurring in the power module part to a DC circuit, and the inductance of the busbars can be reduced by increasing a width thereof.

However, if the busbars are increased in width, this is not desirable because it also increases the weight and the manufacturing cost. In this regard, if the busbars are decreased in thickness, this can reduce the weight, but increase the inductance.

SUMMARY OF THE DISCLOSURE

Therefore, the present inventors focused on the following relationship between the weight and the inductance of the busbar. When the busbars are decreased in thickness, it increases the inductance, and the inductance has a correlation with the sum of the width and the thickness of the busbar. Thus, when the busbar has a shape in which the width is greater than the thickness, an increasing amount of the inductance to a ratio of decreasing the thickness is less than an increasing amount of the inductance to a ratio of decreasing the width. On the other hand, the weight decreases at a ratio that is the same as a decreasing ratio of the thickness. Therefore, the present inventors have considered that, for the busbars provided to the smoothing part, it becomes possible to reduce the inductance while suppressing the increases in the weight and the manufacturing cost by making the busbars wider and thinner.

On the other hand, for the busbars of the smoothing part, if the entire busbars including a connecting part with the power module part are decreased in thickness, the rigidity may decrease due to such a thin structure, and the connecting part with the power module part and its vicinities may rise in temperature, thereby decreasing durability.

The present disclosure is made in view of solving the above problems, and one purpose thereof is to provide a power converter capable of suppressing a high-frequency noise occurring in a power module part from leaking to a DC circuit, while suppressing increases in weight and manufacturing cost and realizing high durability.

A power converter according to one aspect of the present disclosure includes a power module part and a smoothing part. The power module part has a plurality of power modules arrayed in a first direction. The smoothing part is disposed so as to be adjacent to the power module part on a first side in a second direction which intersects with the first direction and to electrically intervene between the power module part and a direct-current circuit, and the smoothing part includes a smoothing capacitor, a cathode-side connection busbar, and an anode-side connection busbar. The smoothing capacitor has a cathode-side terminal and an anode-side terminal. The cathode-side connection busbar connects the cathode-side terminal and the power module part. The anode-side connection busbar connects the anode-side terminal and the power module part.

In the power converter according to this aspect, a first connection busbar, which is one of the cathode-side connection busbar and the anode-side connection busbar, has a first plate-shaped busbar and a second busbar. The first busbar is connected to a first terminal, which is one of the cathode-side terminal and the anode-side terminal. The first terminal corresponds in polarity to the first connection busbar. The second busbar connects the first busbar and the power module part. The first busbar has a terminal joining part and an extended part, the terminal joining part being disposed along the corresponding polarity terminal, and the extended part being disposed along a side surface of the smoothing capacitor so that the extended part extends continuously to the terminal joining part and extends toward a power module part side of the power converter. The second busbar has a base part extending in the first direction and joined to a surface of the extended part of the first busbar on the power module part side, and a connection piece part extending toward the power module part side from the base part and connecting between the base part and a power module terminal of the power module part.

In the power converter according to this aspect, the terminal joining part and the extended part of the first busbar are formed so as to have a width in the first direction that is greater than a width of the connection piece part of the second busbar, and a thickness that is less than a thickness of the base part and the connection piece part of the second busbar.

In the power converter according to this aspect, the terminal joining part and the extended part of the first busbar are formed so as to have the width greater than that of the connection piece part of the second busbar. Thus, the inductance can be lowered, as compared with a case where the width of the terminal joining part and the extended part of the first busbar is equal to or less than that of the connection piece part of the second busbar.

Further, in the power converter according to this aspect, the terminal joining part and the extended part of the first busbar are formed so that their thickness becomes less than that of the base part and the connection piece part of the second busbar. Thus, the increases in the weight and the manufacturing cost can be suppressed, while lowering the inductance, as compared with a case where the thickness of the terminal joining part and the extended part of the first busbar is equal to or more than that of the base part and the connection piece part of the second busbar.

Further, in the power converter according to this aspect, the thickness of the connection piece part of the second busbar becomes greater than that of the terminal joining part and the extended part of the first busbar. Thus, by securing a greater cross-sectional area compared with a case where the thickness of the connection piece part of the second busbar is equal to or less than that of the terminal joining part and the extended part of the first busbar, it can suppress the decrease in the rigidity, and the decrease in the durability due to a temperature rise in the connecting part with the power module terminal and its vicinities.

Further, in the power converter according to this aspect, the base part of the second busbar with the thickness greater than the terminal joining part and the extended part of the first busbar is joined to the extended part of the first busbar. Thus, the rigidity of the extended part of the first busbar can be reinforced by the base part of the second busbar. Therefore, in the power converter according to this aspect, the high rigidity of the one connection busbar can be secured, while lowering the inductance and suppressing the increases in the weight and the manufacturing cost.

In the power converter according to this aspect, the smoothing part may further have an additional constituent member different from the smoothing capacitor, the cathode-side connection busbar, and the anode-side connection busbar, the additional constituent member being disposed adjacent to the first busbar on a first side in the first direction. The terminal joining part and the extended part in the first busbar may be disposed so as to be offset toward a second side in the first direction to avoid the additional constituent member. The base part of the second busbar may be disposed so as to project toward the first side in the first direction with respect to a side edge of the first busbar on the first side in the first direction.

In the power converter according to this aspect, the additional constituent member is disposed on the first side of and adjacent to the first busbar in the first direction so that the terminal joining part and the extended part of the first busbar are offset toward the second side in the first direction. However, since the base part of the second busbar projects toward the first side in the first direction from the side edge of the first busbar, the connection between the power module terminal and the connection piece part of the second busbar is possible, while securing a high degree of freedom in the design, even if the first busbar is offset.

In the power converter according to this aspect, a direction intersecting both the first direction and the second direction may be a third direction, and the extended part of the first busbar may extend toward a first side in the third direction from an end edge part of the terminal joining part on the power module part side. In such a case, the power converter may further be provided with a cooling part thermally coupled with the first busbar in the smoothing part and disposed on a second side in the third direction to the terminal joining part of the first busbar. The base part of the second busbar may be connected to the connection piece part at the end edge part on the first side in the third direction.

In the power converter according to this aspect, the base part of the second busbar is connected to the connection piece part at the end edge part in the third direction, and is positioned on the second side in the third direction with respect to the connecting part. Thus, the joining area between the base part of the second busbar and the extended part of the first busbar is the area from the connecting part with the connection piece part in the third direction to the second side. Further, the cooling part is disposed on the second side in the third direction with respect to the terminal joining part of the first busbar. Thus, the heat of the connection piece part of the second busbar is cooled by heat absorption via the base part and the extended part and the terminal joining part of the first busbar. Therefore, the power converter according to this aspect is advantageous to realize the high durability of the second busbar.

In the power converter according to this aspect, a second connection busbar, which is the other of the cathode-side connection busbar and the anode-side connection busbar, may include a plate-shaped third busbar connected to a second terminal, which is the other of the cathode-side terminal and the anode-side terminal, the first terminal corresponding in polarity to the second connection busbar, the third busbar having a terminal joining part disposed along the second terminal, and an extended part disposed along a side surface of the smoothing capacitor so that the extended part extends continuously to the terminal joining part and extends toward the power module part side, and a fourth busbar connecting the extended part of the third busbar and the power module part, the fourth busbar having a base part extending in the first direction and joined to a surface of the extended part on the power module part side, and a connection piece part extending toward the power module part side from the base part and connecting between the base part and a power module terminal of the power module part.

In the power converter according to this aspect, the terminal joining part and the extended part of the third busbar may be formed so as to have a width in the first direction that is greater than a width of the connection piece part of the fourth busbar, and a thickness that is less than a thickness of the base part and the connection piece part of the fourth busbar.

In the power converter according to this aspect, the terminal joining part and the extended part of the third busbar are also formed so as to have the width greater than that of the connection piece part of the fourth busbar. Thus, the inductance can be lowered, as compared with a case where the width of the terminal joining part and the extended part of third busbar is equal to or less than that of the connection piece part of the fourth busbar.

Further, in the power converter according to this aspect, the terminal joining part and the extended part of the third busbar are also formed so that their thickness becomes less than that of the base part and the connection piece part of the fourth busbar. Thus, the increases in the weight and the manufacturing cost can be suppressed, while lowering the inductance, as compared with a case where the thickness of the terminal joining part and the extended part of the third busbar is equal to or more than that of the base part and the connection piece part of the fourth busbar.

Further, in the power converter according to this aspect, the connection piece part of the fourth busbar is formed so as to have a thickness greater than that of the terminal joining part and the extended part of the third busbar. Thus, by securing a greater cross-sectional area compared with a case where the thickness of the connection piece part of the fourth busbar is equal to or less than that of the terminal joining part and the extended part of the third busbar, it can suppress the decrease in the rigidity, and the decrease in the durability due to the temperature rise in the connecting part with the power module terminal and its vicinities.

Further, in the power converter according to this aspect, since the base part of the fourth busbar with the thickness greater than that of the terminal joining part and the extended part of the third busbar is joined to the extended part of the third busbar, the rigidity of the extended part of the third busbar is reinforced by the base part of the fourth busbar. Therefore, in the power converter according to this aspect, the high rigidity of the one connection busbar is secured, while lowering the inductance and suppressing the increases in the weight and the manufacturing cost.

In the power converter according to this aspect, the extended part of the first busbar and the extended part of the third busbar may be overlapped with each other in a non-contacting fashion.

In the power converter according to this aspect, since the extended part of the first busbar and the extended part of the third busbar are overlapped with each other in the non-contacting fashion, the strength at the part where the extended parts are overlapped with each other can be increased, as compared with a case where the extended part of the first busbar and the extended part of the third busbar are disposed separately.

Further, at the part where the extended part of the first busbar and the extended part of the third busbar are over-lapped with each other, principal parts of the cathode-side connection busbar and the anode-side connection busbar face to each other at the non-contacting state, and parasitic capacitance occurs there. Therefore, in the power converter according to this aspect, the high-frequency noise occurred in the power module part can be returned to the power module part side by the smoothing part, and therefore it is advantageous for suppressing that the high-frequency noise leaks to the DC circuit.

The power converter according to this aspect may further include a noise removing part disposed between the smoothing part and the direct-current circuit in an electric power circulation path, and comprised of a ferrite core.

In the power converter according to this aspect, since the noise removing part is disposed between the smoothing part and the DC circuit in the electric power circulation path, it is more advantageous for suppressing that the high-frequency noise occurred in the power module part leaks to the external DC circuit.

6

Figure 9:
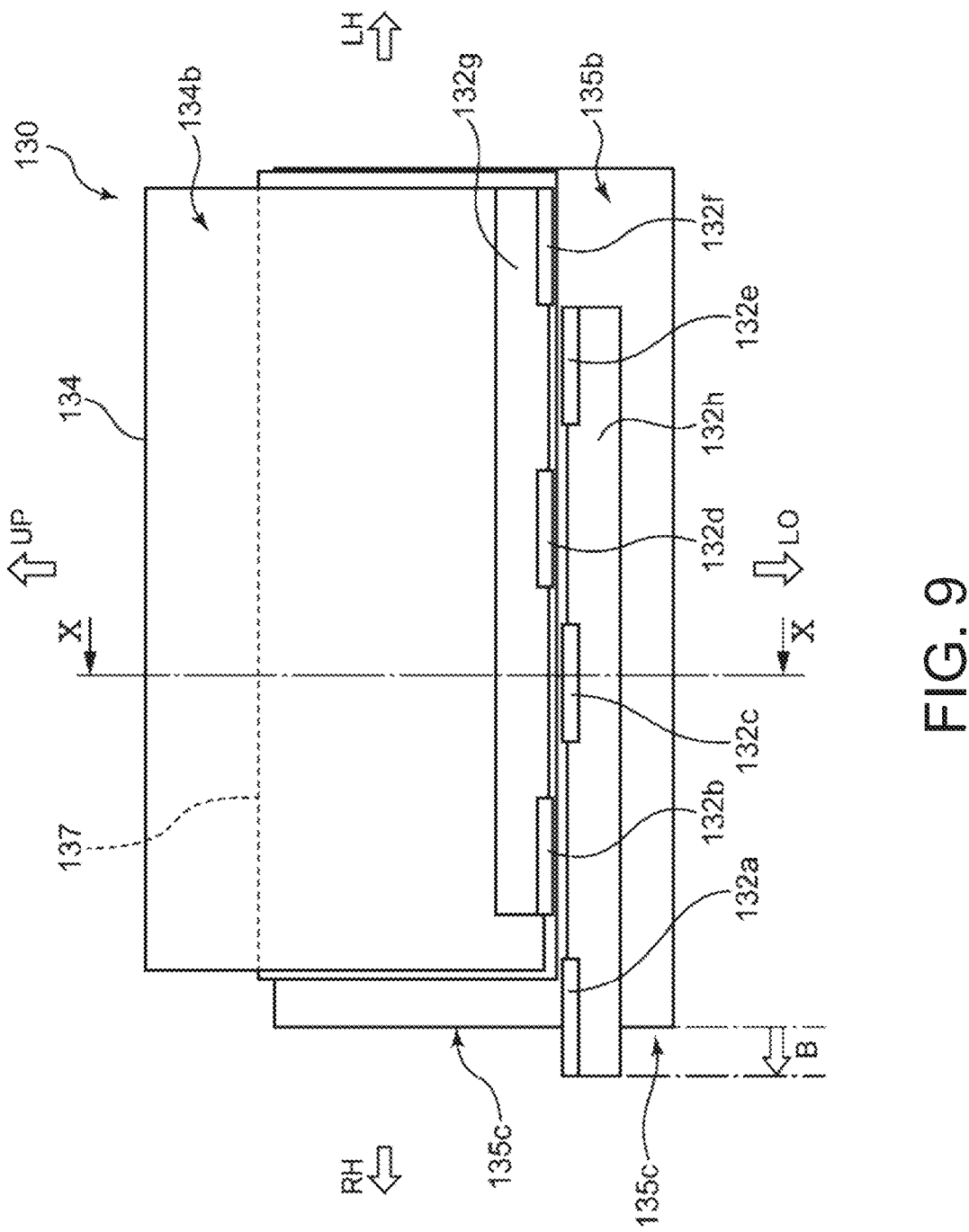

FIG. 9 is a front view illustrating the cathode plate-shaped busbars and the anode plate-shaped busbars, and the plus busbars and the minus busbars.

Figure 10:
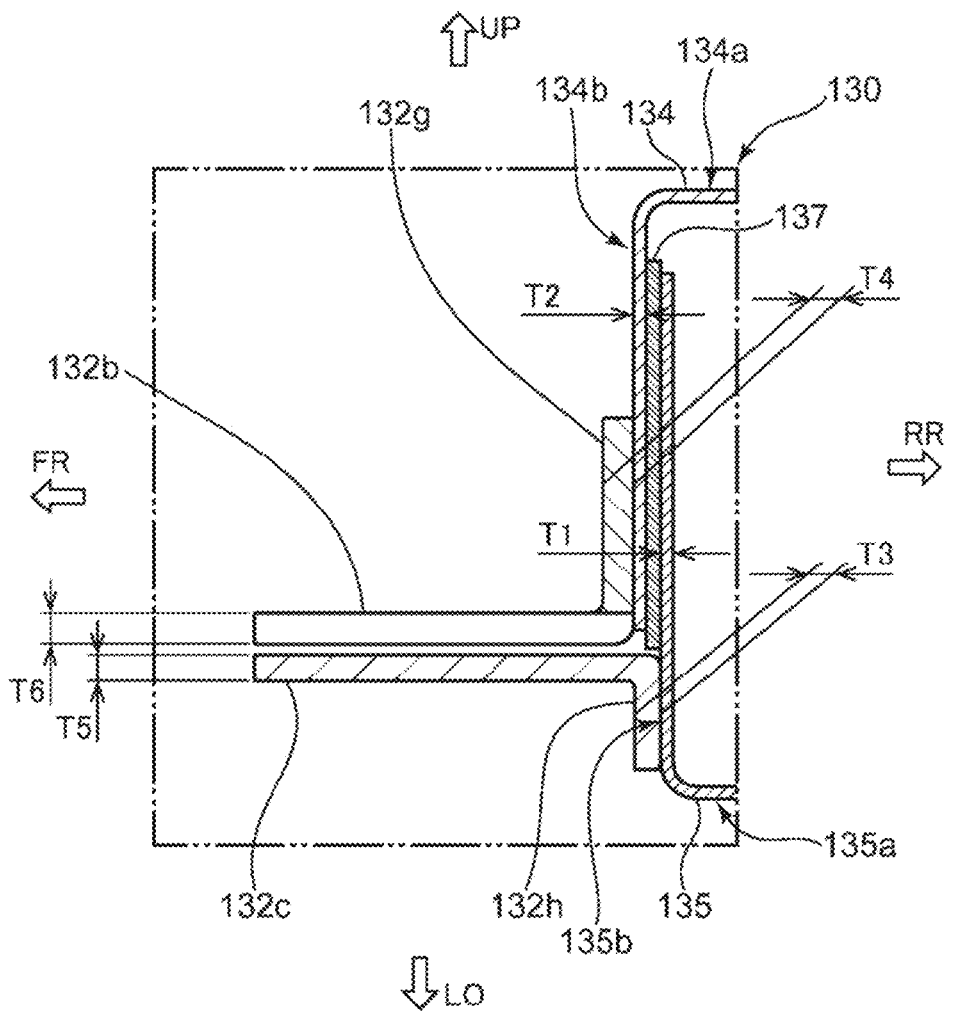

FIG. 10 is a cross-sectional view illustrating the cathode plate-shaped busbars and the anode plate-shaped busbars, and the plus busbars and the minus busbars.

Figure 11:
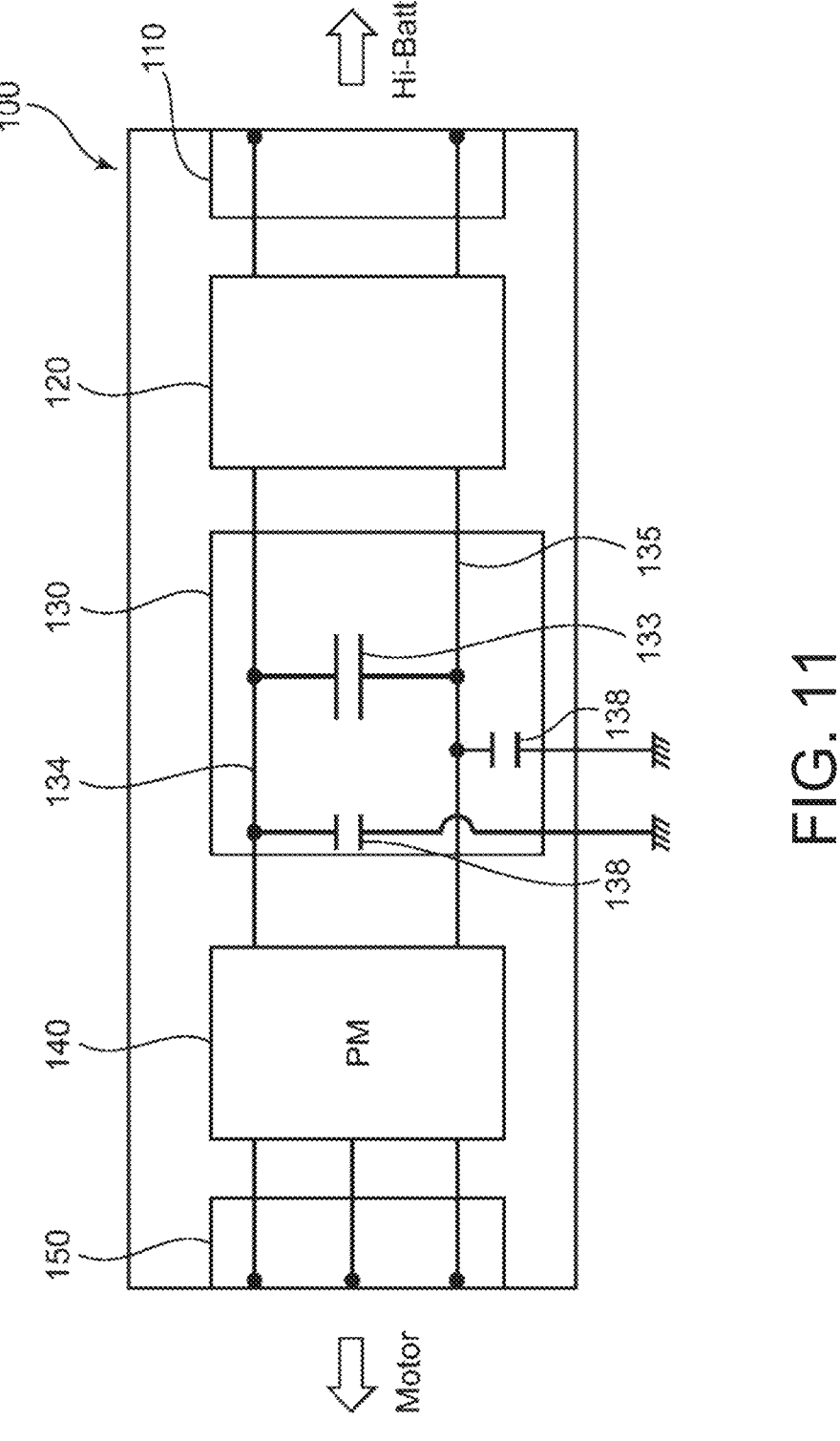

FIG. 11 is a block diagram illustrating a configuration of the power converter.

DETAILED DESCRIPTION OF THE DISCLOSURE

Hereinafter, one embodiment of the present disclosure is described with reference to the accompanying drawings. Note that the following embodiment merely illustrates the present disclosure exemplarily, and the present disclosure is not limited to the following embodiment at all, except for the essential configuration.

1. Configuration of Vehicle V

A configuration of a vehicle V which carries a power converter 100 according to one embodiment of the present disclosure is described with reference to FIG. 1. Note that, below, a front/rear direction of the vehicle V (vehicle longitudinal direction) is simply described as a "front-and-rear direction," a left/right direction of the vehicle V (vehicle width direction) is simply described as a "left-and-right direction," and an up/down direction of the vehicle V (vehicle vertical direction) is simply referred to as an "up-and-down direction." Further, in this embodiment, the left-and-right direction corresponds to a "first direction," the front-and-rear direction corresponds to a "second direction," and the up-and-down direction corresponds to a "third direction."

Figure 1:
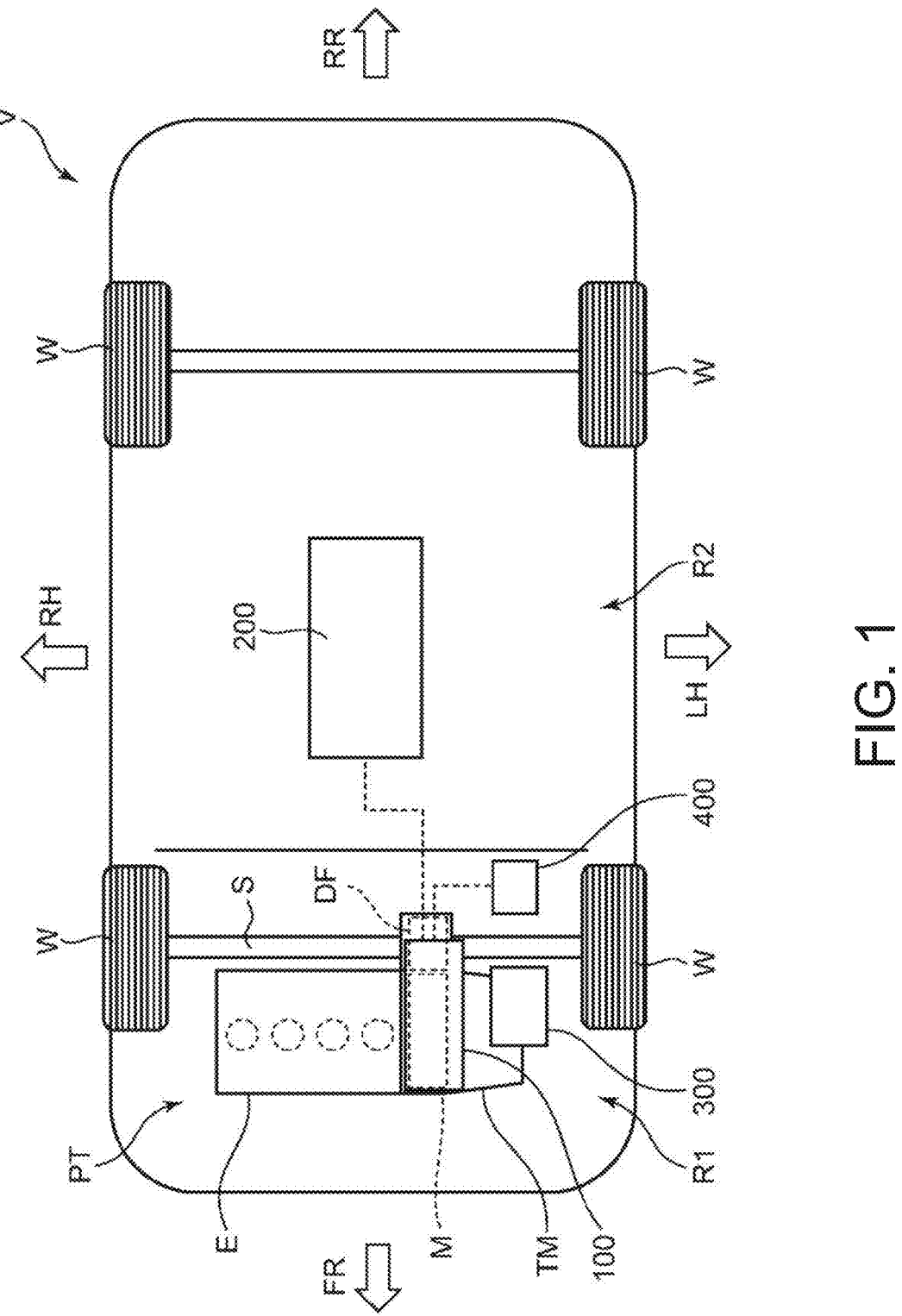
FIG. 1 is a schematic diagram illustrating a configuration of a vehicle provided with a power converter according to one embodiment of the present disclosure.

As illustrated in FIG. 1, a powertrain PT, the power converter 100, a high-voltage battery 200, and a low-voltage battery 300 are mounted on the vehicle V.

The vehicle V is a so-called Hybrid Electric Vehicle (HEV), and carries an engine E and a motor M which function as driving sources for propelling the vehicle V (i.e., wheels W). The powertrain PT is provided with the engine E and the motor M. The powertrain PT includes a transmission TM and a differential gear DF, in addition to the engine E and the motor M.

The motor M is an alternating current (AC) motor of a three-phase three-line type which rotates in response to supply three-phase AC power, and includes an output shaft, a rotor having permanent magnets disposed around the output shaft, and a stator having a plurality of teeth disposed around the rotor where a coil is wound around each tooth. The plurality of coils are comprised of a U-phase coil, a V-phase coil, and a W-phase coil, and are supplied with current of different phases.

The transmission TM is connected to the motor M, and decelerates the rotation inputted from the motor M and outputs the decelerated rotation. The differential gear DF transmits the rotation outputted from the transmission TM to the wheels W via a drive shaft S.

In this embodiment, for example, a parallel-type hybrid electric vehicle is used as the vehicle V, which is capable of traveling only by a driving force of the motor M, traveling only by a driving force of the engine E, and traveling by the driving forces of both the motor M and the engine E. Note that the vehicle V is capable of performing regenerative deceleration in which the motor M generates power by a force transmitted from the wheels W when the vehicle V slows down.

The high-voltage battery 200 is a battery which delivers and receives electric power to/from the motor M. When the motor M functions as the driving source for propelling the vehicle, the high-voltage battery 200 supplies power to the motor M. On the other hand, when the motor M functions as a power generator during the slowdown of the vehicle V, the high-voltage battery 200 stores power generated by the motor M.

The power converter 100 is an inverter device connected to the three-phase three-line motor M, which converts direct current (DC) power from the high-voltage battery 200 into AC power and supplies the AC power to the motor M. Concretely, the power converter 100 converts DC power supplied from the high-voltage battery 200 through a DC circuit into three-phase AC power, and supplies the three-phase AC power to the motor M.

Further, when the motor M functions as the power generator during the slowdown of the vehicle V, the power converter 100 converts AC power generated by the motor M into DC power, and supplies the DC power to the high-voltage battery 200 through the DC circuit.

The low-voltage battery 300 is a battery for supplying electric power to electric parts provided to various parts of the vehicle V. The low-voltage battery 300 is a battery of which the nominal voltage is lower than the high-voltage battery 200.

Note that, for example, the high-voltage battery 200 is a lithium-ion battery or a nickel-hydrogen battery with a nominal voltage of 24V or higher, while the low-voltage battery 300 is a lead battery or a lithium-ion battery with the nominal voltage of 12V or 24V.

In this embodiment, the powertrain PT, the power converter 100, and the low-voltage battery 300 are accommodated in a powertrain room R1 defined in a front part of the vehicle V. The high-voltage battery 200 is mounted under the floor of a cabin R2 defined behind the powertrain room R1.

Note that a PCM (Powertrain Control Module) 400 which is a controller for comprehensively controlling the powertrain PT including the motor M and the engine E is mounted on the vehicle V.

2. Layout of Power Converter 100

Figure 2:
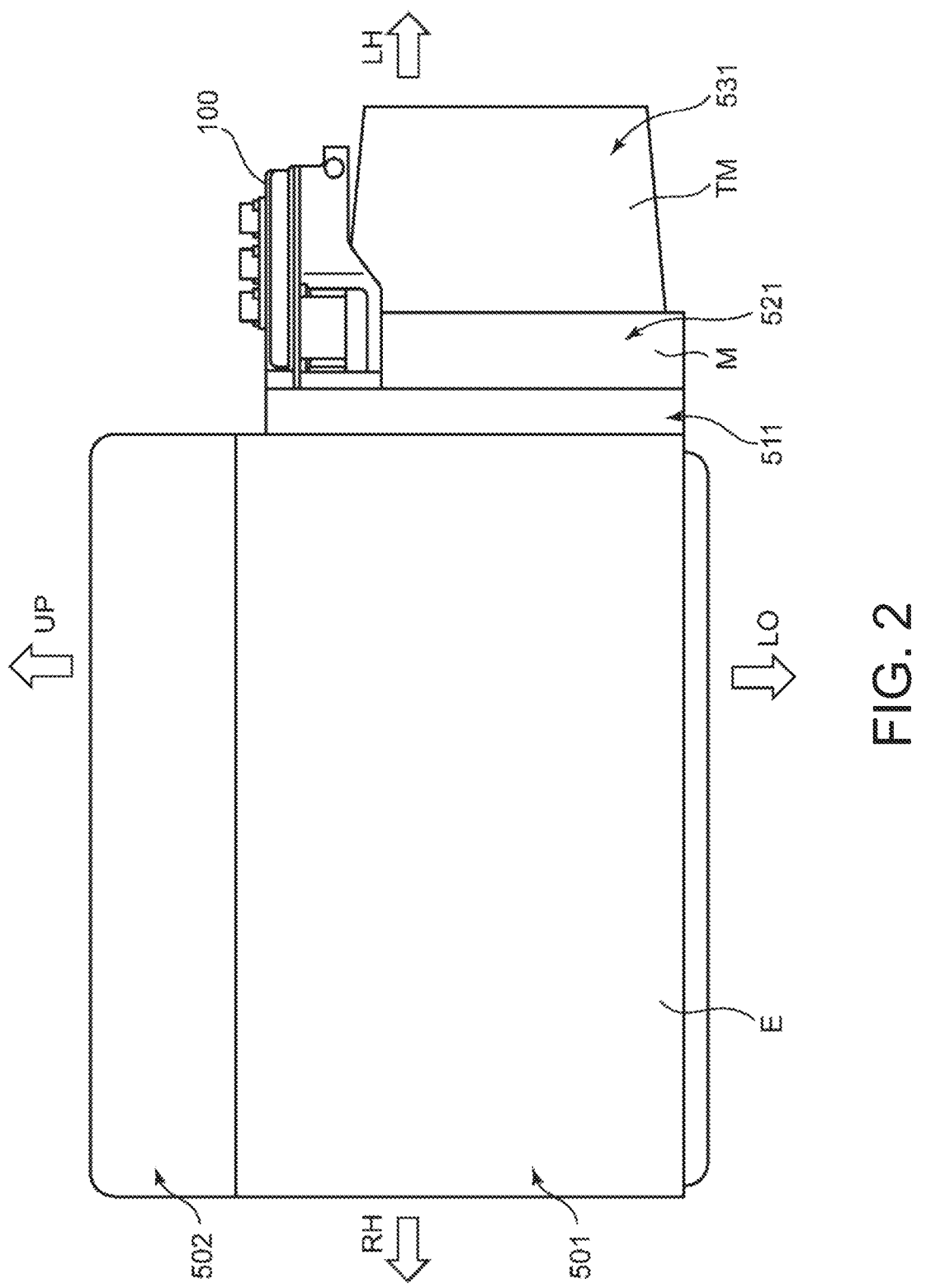
FIG. 2 is a front view illustrating a layout of the power converter.

The layout of the power converter 100 inside the powertrain room R1 is described with reference to FIG. 2. FIG. 2 is a front view of the power converter 100 and its peripheral equipment when seen from the front side of the vehicle V. Note that, in FIG. 2, illustration of the low-voltage battery 300 is omitted.

As illustrated in FIG. 2, inside the powertrain room R1, the engine E, the motor M, and the transmission TM are disposed in this order from the right. The engine E has an engine lower part 501 and an engine upper part 502 disposed above the engine lower part 501. The motor M is disposed on the left of and adjacent to the engine lower part 501 of the engine E.

The motor M has a first motor housing 511 and a second motor housing 521 as an outer shell. The first motor housing 511 is joined to a left side surface of the engine lower part 501, and the second motor housing 521 is connected to the left side of the first motor housing 511 without a gap.

The transmission TM has an axle housing 531 as an outer shell. The axle housing 531 has a frustum shape in which the cross-sectional size gradually decreases from the right toward the left.

The power converter 100 is disposed, in the left-and-right direction of the vehicle V, from a part above the second motor housing 521 to a part above the axle housing 531. The motor M and the power converter 100 are connected by bonding between a connector (not illustrated) formed in the first motor housing 511 and a connector (not illustrated) of the power converter 100.

Note that in a direction perpendicular to the drawing sheet of FIG. 2, a front end part of the power converter 100 (a closer end part in the drawing) is disposed at a position which is flush with a front end part of any one of the first motor housing 511, the second motor housing 521, and the axle housing 531 (a closer end part in the drawing), or a position which is rearward thereof (on the deeper side).

3. Configuration of Power Converter 100

A configuration of the power converter 100 is described with reference to FIGS. 3 and 4.

Figure 3:
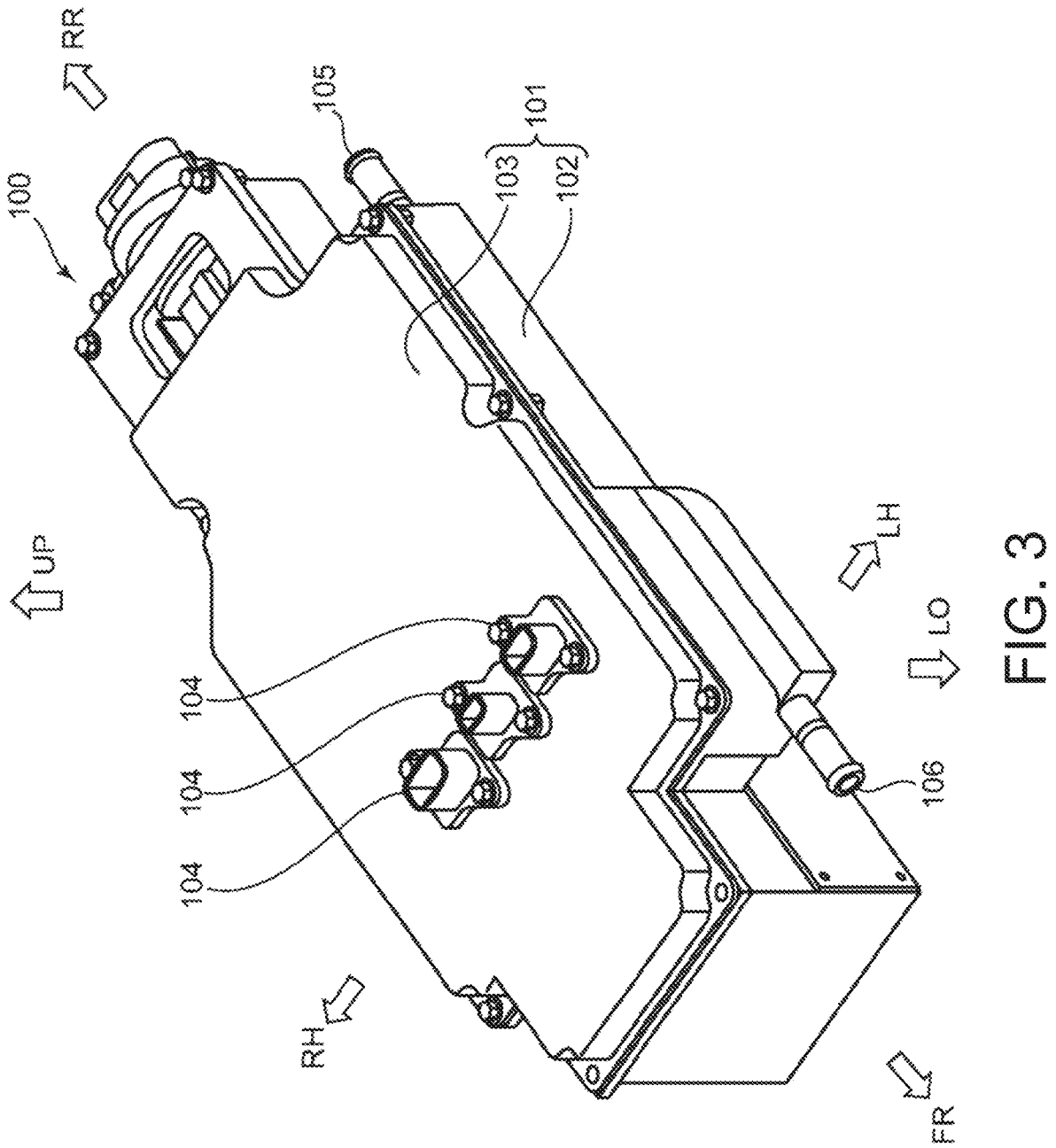
FIG. 3 is a perspective view illustrating an external configuration of the power converter.

As illustrated in FIG. 3, the power converter 100 is provided with a case 101 which is comprised of a case body 102 and a lid 103 as an outer shell. The case body 102 has an upward opening, and the lid 103 closes the opening of the case body 102.

Two refrigerant ports 105 and 106 are provided to a lower part of a left side wall of the case body 102. Refrigerant is introduced into the case 101 from one of the refrigerant ports 105 and 106, and is discharged from the other port. The refrigerant introduced into the case 101 absorbs heat of a part constituting the power converter 100 including the smoothing part (described later).

Three PCM connectors 104 project upwardly from a front part of the lid 103. The PCM 400 (see FIG. 1) is connected to the power converter 100 via the PCM connectors 104.

Figure 4:
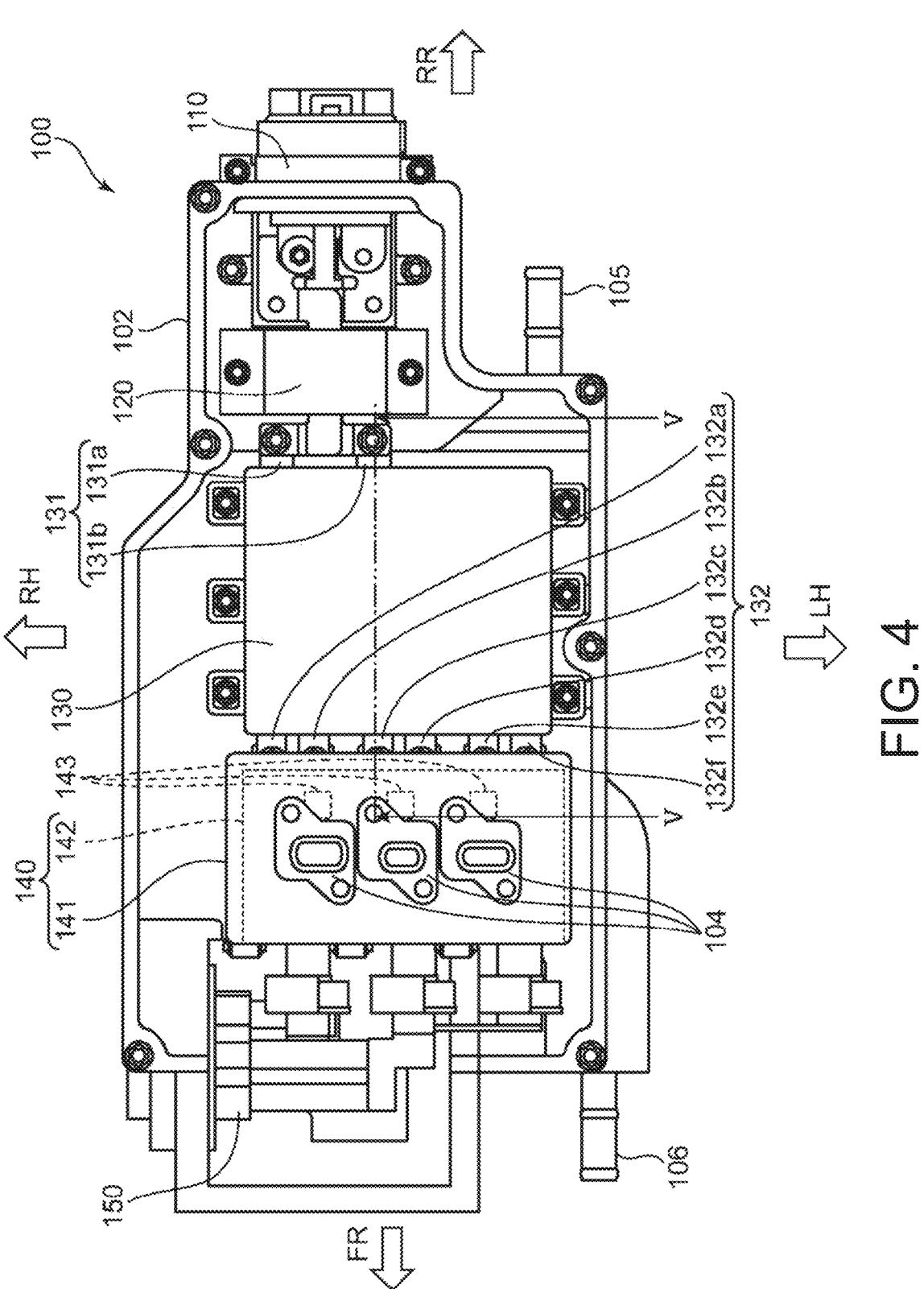
FIG. 4 is a plan view illustrating an internal configuration of the power converter.

As illustrated in FIG. 4, the power converter 100 includes a DC connector part 110, a noise removing part 120, a smoothing part 130, a power module part 140, and an AC connector part 150, which are accommodated inside the case 101 (in FIG. 4, illustration of the lid 103 is omitted). The DC connector part 110, the noise removing part 120, the smoothing part 130, the power module part 140, and the AC connector part 150 are disposed in this order from the rear side to the front side of the vehicle V in the front-and-rear direction.

The DC connector part 110 is a connector part connected to the DC circuit including the high-voltage battery 200, and a part thereof projects rearwardly from the case body 102. The AC connector part 150 is a connector part connected to the motor M, and a part thereof projects toward the right side of the case body 102.

The noise removing part 120 is comprised of a ferrite core, and is a functional part for suppressing high-frequency noise leaks to the DC circuit which continue from the power converter 100 to the high-voltage battery 200. The noise removing part 120 is inserted between the smoothing part 130 and the DC circuit in the electric power circulation path (in detail, between the smoothing part 130 and the DC connector part 110 in the electric power circulation path).

The smoothing part 130 is a functional part for smoothing DC power, and includes a smoothing capacitor (e.g., a film capacitor). The smoothing part 130 includes two busbars 131 (a plus busbar 131a and a minus busbar 131b) for connection with the DC connector part 110, and six busbars 132 (plus busbars 132b, 132d, and 132f, and minus busbars 132a, 132c, and 132e) for connection with the power module part 140. Note that, in the six busbars 132, the plus busbars 132b, 132d, and 132f respectively form pairs with the adjacent minus busbars 132a, 132c, and 132f. That is, the six busbars 132 are comprised of three pairs of the busbars 132.

In this embodiment, the minus busbars 132a, 132c, and 132e are examples of "connection piece parts of second busbars," and the plus busbars 132*b*, 132*d*, and 132*f* are examples of "connection piece parts of fourth busbars."

The detailed structure of the smoothing part 130 will be described later.

The power module part 140 includes a module body part 141 having three power modules 143, and a controlling circuit part 142 which electrically controls the power modules 143 of the module body part 141. In this embodiment, the power modules 143 are comprised of an IGBT (Insulated Gate Bipolar Transistor). Note that the power module is not limited to IGBT, and it may be a known power module, such as a MOSFET (Metal Oxide Semiconductor Field Effect Transistor).

The PCM connector 104 is connected to the controlling circuit part 142. A controller formed in the controlling circuit part 142 controls the power modules 143 of the module body part 141 in response to a command from the PCM 400 (see FIG. 1) to change a conversion amount between DC power and AC power. Note that, in FIG. 4, the detailed illustration of the controlling circuit part 142 is omitted.

The AC connector part 150 partially penetrates a side wall of the case body 102 and extends rightwardly and outwardly. The AC connector part 150 is connected with a motor-side connector provided to the first motor housing 511 (see FIG. 2).

4. Detailed Structure of Smoothing Part 130

The detailed structure of the smoothing part 130 of the power converter 100 is described with reference to FIGS. 5 to 11.

Figure 5:
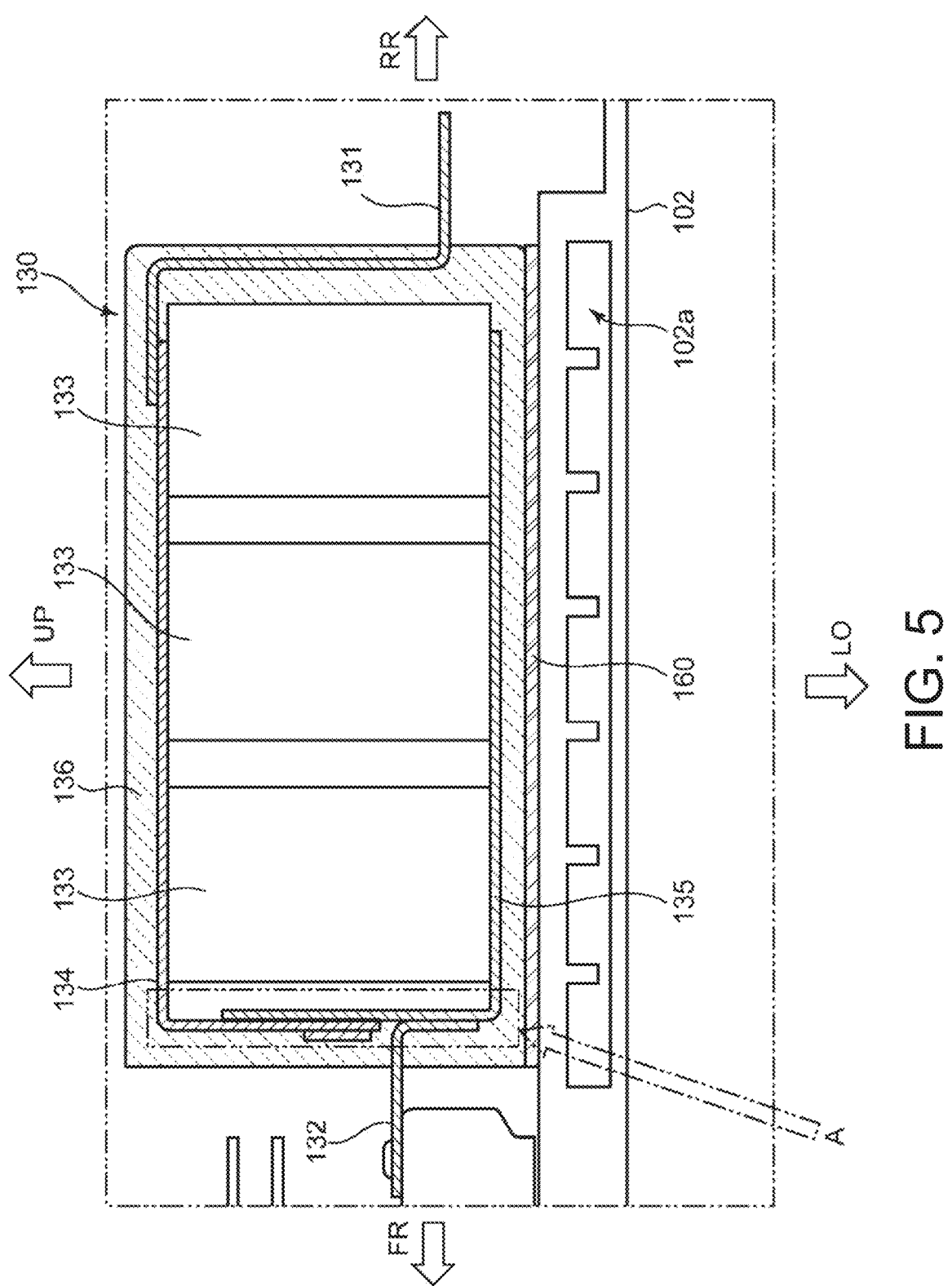
FIG. 5 is a cross-sectional view taken along a line V-V of FIG. 4.
Figure 7:
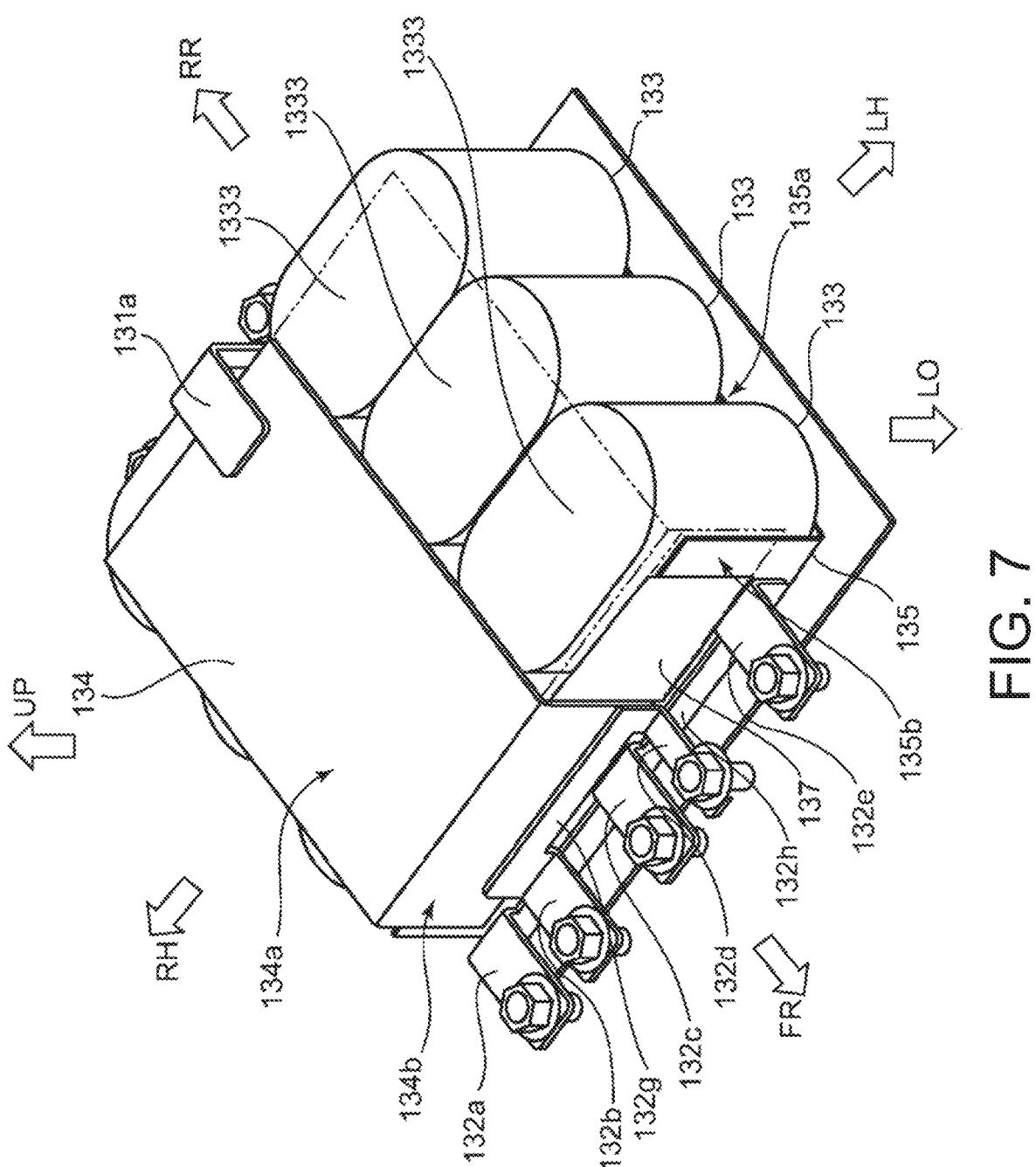
FIG. 7 is a perspective view illustrating a smoothing part which is partially omitted.
Figure 8:
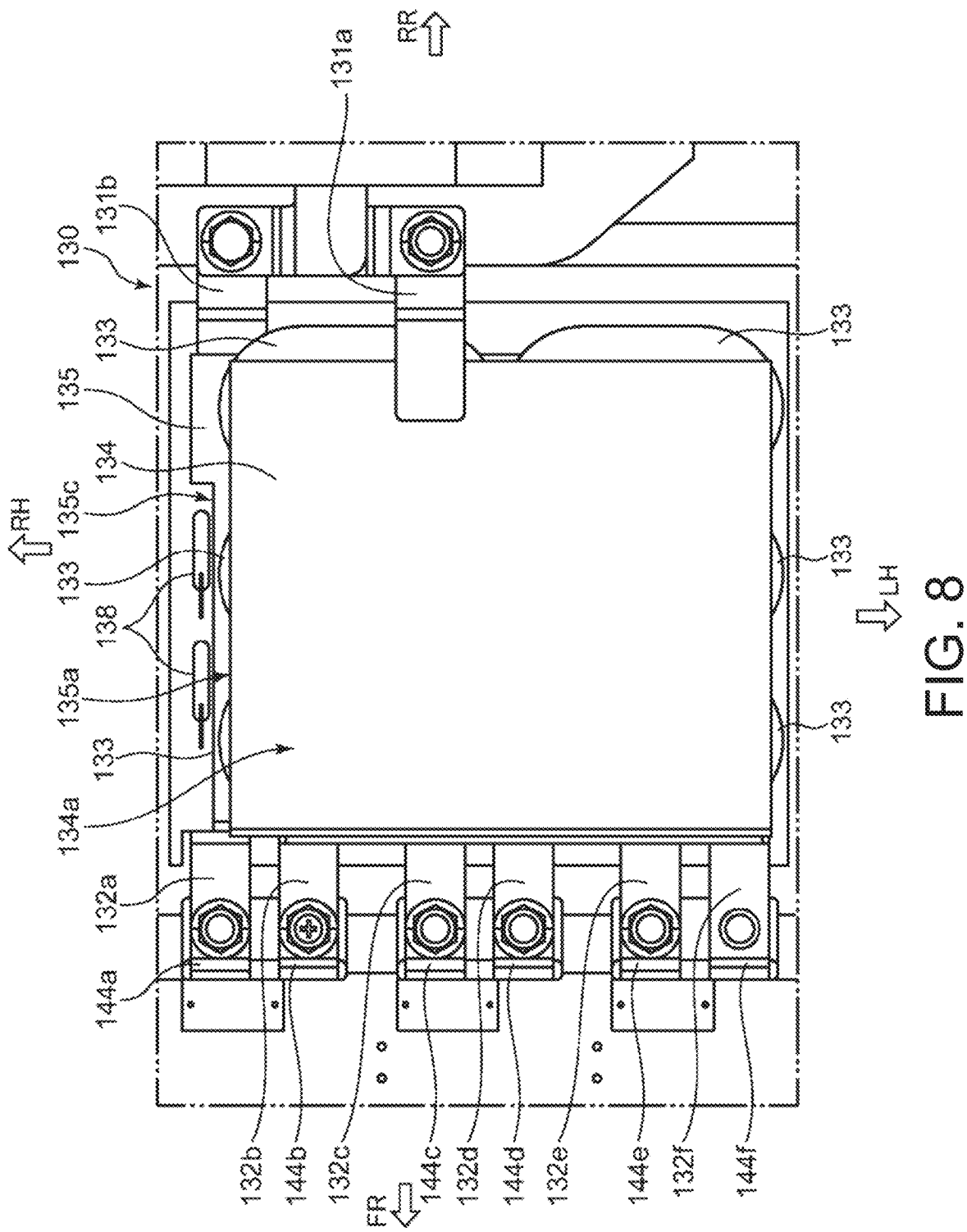
FIG. 8 is a plan view illustrating cathode plate-shaped busbars and anode plate-shaped busbars, and plus busbars and minus busbars.

As illustrated in FIGS. 5, 7, and 8, the smoothing part 130 includes, in addition to the two busbars 131 and the six busbars 132, a plurality of (in this embodiment, six) smoothing capacitors 133, a cathode plate-shaped busbar 134, an anode plate-shaped busbar 135, a resin mold part 136, a partition member 137, and a Y capacitor 138.

Figure 6:
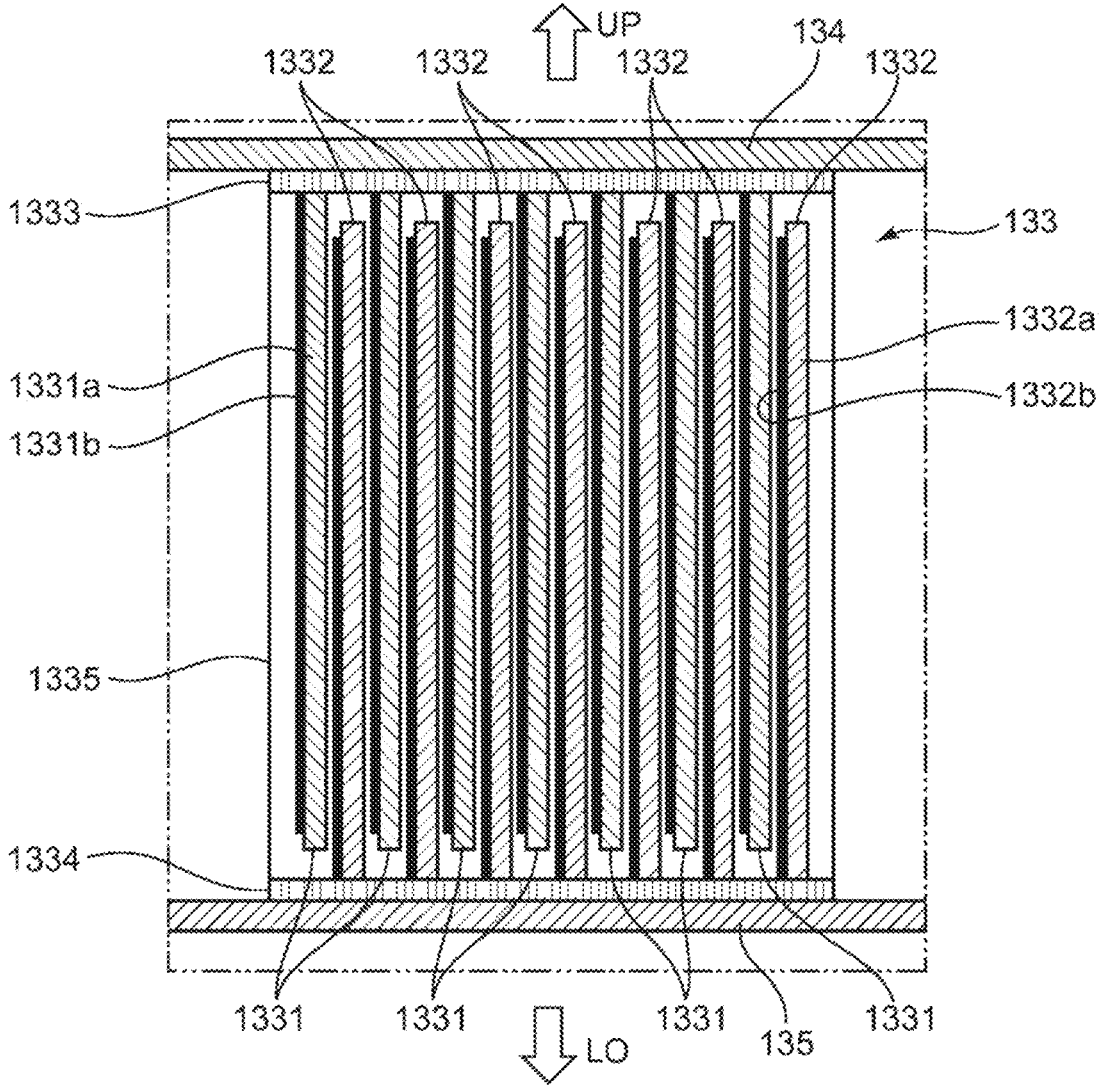
FIG. 6 is a cross-sectional view illustrating an internal configuration of a smoothing capacitor.

As illustrated in FIG. 6, the smoothing capacitors 133 include a cathode 1331, an anode 1332, a cathode-side terminal 1333, an anode-side terminal 1334, and a case 1335. Note that although it is not necessary to adopt a film capacitor as the smoothing capacitor 133, it is desirable to adopt a film capacitor that has no polarity and is excellent in voltage proof, heat resistance, and durability. Here, in this embodiment, based on the connection relationship with the DC connector part 110, a terminal disposed above is the cathode-side terminal 1333, and a terminal disposed below is the anode-side terminal 1334. Further, an electrode connected to the cathode-side terminal 1333 is the cathode 1331, and an electrode connected to the anode-side terminal 1334 is the anode 1332.

The cathode 1331 includes an insulator (dielectric) film 1331*a*, and a metal film 1331*b* formed by vapor deposition onto one of the principal surfaces of this insulator film 1331*a*. The anode 1332 includes an insulator (dielectric) film 1332*a*, and a metal film 1332*b* formed by vapor deposition onto one of the principal surfaces of this insulator film 1332*a*. The cathode-side terminal 1333 and the anode-side terminal 1334 are terminals formed by thermal-spraying metallic material to a resin film. The resin film may be PP (polypropylene), PET (polyethylene terephthalate), PEN (polyethylene naphthalate), or PPS (polyphenylene sulfide). Thermal-spraying metal may be Al (aluminum) or Zn (zinc).

As illustrated in FIGS. 7 and 8, the cathode plate-shaped busbars 134 are busbars, each having a plate shape, which are welded to upper surfaces (the cathode-side terminals 1333) of the six smoothing capacitors 133. The anode plate-shaped busbars 135 are busbars, each having a plate shape, which are welded to a lower surface (the anode-side terminal 1334) of the six smoothing capacitors 133.

Note that each of the cathode plate-shaped busbars 134 and each of the anode plate-shaped busbars 135 may be connected to the entire surfaces of the cathode-side terminal 1333 and the anode-side terminal 1334, respectively, of each of the six smoothing capacitors 133, or may be connected to the surfaces in part.

In this embodiment, the cathode plate-shaped busbars 134 are directly connected to the cathode-side terminals 1333 of the smoothing capacitors 133, and the anode plate-shaped busbars 135 are directly connected to the anode-side terminals 1334. Such a configuration can lower ESL (equivalent in-series inductance) and ESR (equivalent in-series resistance), compared with a case where they are connected via leads.

In this embodiment, the anode plate-shaped busbar 135 is an example of a "first busbar," and the cathode plate-shaped busbar 134 is an example of a "third busbar."

As illustrated in FIG. 7, the cathode plate-shaped busbars 134 have a terminal joining part 134*a* which covers the six smoothing capacitors 133 from above and is connected to the cathode-side terminals 1333 of the smoothing capacitors 133, and an extended part 134*b* which continues to the terminal joining part 134*a* and is disposed along the side surfaces of the smoothing capacitors 133 on the power module part 140 side (front side). The anode plate-shaped busbars 135 have a terminal joining part 135*a* which is disposed below the six smoothing capacitors 133 and is connected to the anode-side terminals 1334 of the smoothing capacitors 133, and an extended part 135*b* which continues to terminal joining part 135*a* and is disposed along the side surfaces of the smoothing capacitors 133 on the power module part 140 side (front side).

As illustrated in FIGS. 5, 7, and 10, the extended part 134*b* of the cathode plate-shaped busbar 134 and the extended part 135*b* of the anode plate-shaped busbars 135 are overlapped with each other in a non-contacting fashion on the power module part 140 side (front side). Further, the partition member 137 is inserted between the extended part 134*b* of the cathode plate-shaped busbar 134 and the extended part 135*b* of the anode plate-shaped busbars 135. The partition member 137 is inserted entirely between the extended part 134*b* of the cathode plate-shaped busbars 134 and the extended part 135*b* of the anode plate-shaped busbars 135. Note that, in this embodiment, the partition member 137 is formed from insulating paper, such as synthetic fiber paper, or an insulating film made of PP (polypropylene), for example.

As illustrated in FIGS. 7 and 9, the plus busbars 132*b*, 132*d*, and 132*f* are connected to a coupling part 132*g* joined to the extended part 134*b* of the cathode plate-shaped busbar 134. The coupling part 132*g* is formed so as to extend in the left-and-right direction and is joined near a lower end part of the extended part 134*b*. Note that the joining between the extended part 134*b* and the coupling part 132*g* is performed, for example, by resistance welding, laser welding, ultrasonic joining, brazing, or crimping.

The minus busbars 132*a*, 132*c*, and 132*e* are connected to a coupling part 132*h* joined to the extended part 135*b* of the anode plate-shaped busbars 135. The coupling part 132*h* is formed so as to extend in the left-and-right direction, and is joined to the extended part 135*b*, below an area which overlaps with the extended part 134*b*. Note that the joining between the extended part 135*b* and the coupling part 132*h* is made, for example, by resistance welding, laser welding, ultrasonic joining, brazing, or crimping.

Here, as illustrated in FIG. 9, the connecting part of the minus busbars 132a, 132c, and 132e to the coupling part 132h is a part near an upper-end edge of the coupling part 132h. In other words, the coupling part 132h is joined to the extended part 135b below the minus busbars 132a, 132c, and 132e.

As illustrated in FIG. 5, a refrigerant passage (cooling part) 102a is provided to the case body 102. The refrigerant passage 102a continues to the refrigerant ports 105 and 106 illustrated in FIGS. 3 and 4, and cools the smoothing part 130. Between the smoothing part 130 and an upper surface of the case body 102 where the refrigerant passage 102a is provided, a heat transfer sheet 160 is inserted in order to raise the cooling efficiency. In this embodiment, a heat transfer sheet 136 made of resin material, such as silicone and acrylics, is adopted. Note that it is also possible to compound filler, such as silicon oxide, alumina, and silicon nitride, or heat transfer material, such as graphite, to the resin material described above.

The minus busbars 132a, 132c, and 132e are thermally-coupled to refrigerant which flows through the refrigerant passage 102a via the coupling part 132h and the extended part 135b. Thus, heat generated at the connecting part between the minus busbars 132a, 132c, and 132e and anode power module terminals 144a, 144c, and 144e (see FIG. 8) of the power module part 140 is efficiently cooled via the coupling part 132h.

Further, as described above, the extended part 134b of the cathode plate-shaped busbar 134 and the extended part 135b of the anode plate-shaped busbars 135 are overlapped with each other having the partition member 137 therebetween. Thus, heat generated at the connecting part between the plus busbars 132b, 132d, and 132f and cathode power module terminals 144b, 144d, and 144f (see FIG. 8) of the power module part 140 is also efficiently cooled via the coupling part 132g, the extended part 134b, and the partition member 137. Therefore, the partition member 137 is desirable to be higher in thermal conductivity than air.

Note that the coupling part 132h of this embodiment is an example of a "base part of the second busbar," and the coupling part 132g is an example of a "base part of the fourth busbar."

As illustrated in FIG. 8, the Y capacitor 138 provided to the smoothing part 130 is disposed on the right side of and adjacent to a right side edge 135c of the anode plate-shaped busbars 135. The Y capacitor 138 is a film capacitor or a ceramic condenser, for example, and is a functional part for bypassing common mode noise to the ground. As illustrated in FIG. 11, the Y capacitor 138 is inserted between each of the cathode plate-shaped busbars 134 and each of the anode plate-shaped busbars 135 in the smoothing part 130, and the case 101.

As illustrated in FIGS. 8 and 9, the anode plate-shaped busbars 135 are disposed so as to be offset to the left side in order for the terminal joining part 135a and the extended part 135b to avoid the Y capacitor 138. For such an offset arrangement of the anode plate-shaped busbars 135, the coupling part 132h projects toward the right beyond the right side edge 135c of the anode plate-shaped busbars 135, as illustrated by an arrow B of FIG. 9.

As illustrated in FIG. 5, the smoothing part 130 is also provided with the resin mold part 136 formed so as to cover the smoothing part 130 from outside, except for a part of tip-end sides of the busbars 131 and a part of tip-end sides of the busbars 132. The resin mold part 136 prevents moisture and dust from entering inside. In this embodiment, the resin mold part 136 is made of epoxy resin.

5. Thicknesses of Cathode Plate-shaped Busbar 134 and Anode Plate-shaped Busbar 135

The thicknesses of the cathode plate-shaped busbar 134 and the anode plate-shaped busbar 135 are described with reference to FIG. 10.

As described above, the cathode plate-shaped busbar 134 has the terminal joining part 134a and the extended part 134b which continue with each other, and the anode plate-shaped busbar 135 has the terminal joining part 135a and the extended part 135b which continue with each other.

Further, as described above, the plus busbars 132b, 132d, and 132f (in FIG. 10, only the plus busbar 132b is illustrated) are connected to the coupling part 132g. Note that, in this embodiment, the plus busbars 132b, 132d, and 132f and the coupling part 132g continue with each other, and are formed integrally.

The minus busbars 132a, 132c, and 132e (in FIG. 10, only the minus busbar 132c is illustrated) are connected to the coupling part 132h. Note that, in this embodiment, the minus busbars 132a, 132c, and 132e and the coupling part 132h continue with each other, and are formed integrally.

Here, the thickness of the extended part 135b of the anode plate-shaped busbar 135 is T1, and the thickness of the extended part 134b of the cathode plate-shaped busbar 134 is T2. Note that, since the terminal joining part 135a and the extended part 135b continue with each other and the terminal joining part 134a and the extended part 134b continue with each other as described above, the thickness of the terminal joining part 135a of the anode plate-shaped busbar 135 is also T1, and the thickness of the terminal joining part 134a of the cathode plate-shaped busbar 134 is also T2 in this embodiment.

Meanwhile, here, the thickness of the coupling part 132h is T3, the thickness of the coupling part 132g is T4, the thickness of each of the minus busbars 132a, 132c, and 132e is T5, and the thickness of each of the plus busbars 132b, 132d, and 132f is T6.

In the power converter 100 according to this embodiment, the following relationship is satisfied.

$$T1 < T3 \tag{1}$$

$$T1 < T5 \tag{2}$$

$$T2 < T4 \tag{3}$$

$$T2 < T6 \tag{4}$$

That is, the cathode plate-shaped busbar 134 is formed with a thickness less than the coupling part 132g and the plus busbars 132b, 132d, and 132f, and the anode plate-shaped busbar 135 is formed with a thickness less than the coupling part 132h and the minus busbars 132a, 132c, and 132e.

Further, in the power converter 100 according to this embodiment, the cathode plate-shaped busbar 134 and the anode plate-shaped busbar 135 are preferred to have the width perpendicular to the current-flowing direction which is 40 times greater or more than the thickness, and more preferred to have the width of 100 times greater or more than the thickness. Since there is a correlation between the sum of the width and the thickness of the busbars and the inductance, an increase in a parasitic inductance in the change ratio in decreasing the thickness T1 of the anode plate-shaped busbar 135 and the thickness T2 of the cathode plate-shaped busbar 134 becomes very small as compared with the same change ratio in a busbar having a square cross-section, while the weight can be reduced at the same ratio as the change ratio in decreasing the thickness. That is, the parasitic inductance can be suppressed by widening both the plate-shaped busbars 134 and 135, and the weight can be effectively reduced, while suppressing the increase in the parasitic inductance due to the decrease in the thickness.

6. Effects

In the power converter 100 according to this embodiment, as illustrated in FIGS. 7 to 9, the terminal joining part 135*a* and the extended part 135*b* of the anode plate-shaped busbar 135 are formed so as to have the width greater than that of the minus busbars 132*a*, 132*c*, and 132*e*. Thus, the inductance can be lowered, as compared with a case where the width of the terminal joining part 135*a* and the extended part 135*b* of the anode plate-shaped busbar 135 is the same as or less than that of the minus busbars 132*a*, 132*c*, and 132*e*.

Further, in the power converter 100, as illustrated in FIG. 10, the terminal joining part 135*a* and the extended part 135*b* of the anode plate-shaped busbar 135 are formed so that their thickness T1 becomes less than that of the minus busbars 132*a*, 132*c*, and 132*e* and the coupling part 132*h*. Thus, increases in the weight and the manufacturing cost can be suppressed, while lowering the inductance, as compared with a case where the thickness T1 of the terminal joining part 135*a* and the extended part 135*b* of the anode plate-shaped busbar 135 is equal to or more than that of the minus busbars 132*a*, 132*c*, and 132*e* and the coupling part 132*h*.

Further, in the power converter 100, as illustrated in FIG. 10, the thickness T5 of the minus busbars 132*a*, 132*c*, and 132*e* becomes greater than that of the terminal joining part 135*a* and the extended part 135*b* of the anode plate-shaped busbar 135. Thus, by securing a greater cross-sectional area compared with a case where the thickness T5 of the minus busbars 132*a*, 132*c*, and 132*e* is equal to or less than that of the terminal joining part 135*a* and the extended part 135*b* of the anode plate-shaped busbar 135, it can suppress the decrease in the rigidity, and the decrease in the durability due to a temperature rise in the connecting part with the anode power module terminals 144*a*, 144*c*, and 144*e*, and its vicinities.

Further, in the power converter 100, as illustrated in FIGS. 7, 9, and 10, the coupling part 132*h* (with the thickness T3) thicker than the terminal joining part 135*a* and the extended part 135*b* of the anode plate-shaped busbar 135 is joined to the extended part 135*b* of the anode plate-shaped busbar 135. Thus, the rigidity of the extended part 135*b* of the anode plate-shaped busbar 135 can be reinforced by the coupling part 132*h*. Therefore, in the power converter 100, the high rigidity of the anode plate-shaped busbar 135, the coupling part 132*h*, and the minus busbars 132*a*, 132*c*, and 132*e* can be secured, while lowering the inductance and suppressing the increases in the weight and the manufacturing cost.

Further, in the power converter 100, as illustrated in FIGS. 8 and 9, the Y capacitor 138 is disposed on the right side of and adjacent to the anode plate-shaped busbar 135 so that the terminal joining part 135*a* and the extended part 135*b* of the anode plate-shaped busbar 135 are offset to the left side. However, since the coupling part 132*h* projects toward the right side from the side edge 135*c* of the anode plate-shaped busbar 135, the connection between the anode power module terminals 144*a*, 144*c*, and 144*e* and the minus busbars 132*a*, 132*c*, and 132*e* is possible, while securing a high degree of freedom in the design, even if the anode plate-shaped busbar 135 is offset to the left side as illustrated in FIGS. 8 and 9.

Further, in the power converter 100, as illustrated in FIGS. 5, 9, and 10, since the coupling part 132*h* is connected to the minus busbars 132*a*, 132*c*, and 132*e* at the upper end edge part, it is joined to the extended part 135*b* of the anode plate-shaped busbar 135 in the area from the connecting part with the minus busbars 132*a*, 132*c*, and 132*e* to a part below the connecting part (width direction domain of the coupling part 132*h*). Thus, the heat of the minus busbars 132*a*, 132*c*, and 132*e* is cooled by heat absorption of the refrigerant which circulates the refrigerant passage 102*a* via the coupling part 132*h* and the extended part 135*b* and the terminal joining part 135*a* of the anode plate-shaped busbar 135. Therefore, the power converter 100 is advantageous to realize the high durability of the minus busbars 132*a*, 132*c*, and 132*e* and the coupling part 132*h*.

Further, in the power converter 100, as illustrated in FIGS. 7 to 9, the terminal joining part 134*a* and the extended part 134*b* of the cathode plate-shaped busbar 134 are also formed so as to have the width more than that of the plus busbars 132*b*, 132*d*, and 132*f*. Thus, the inductance can be lowered, compared with a case where the width of the terminal joining part 134*a* and the extended part 134*b* of the cathode plate-shaped busbar 134 is equal to or less than that of the plus busbars 132*b*, 132*d*, and 132*f*.

Further, in the power converter 100, as illustrated in FIG. 10, the terminal joining part 134*a* and the extended part 134*b* of the cathode plate-shaped busbar 134 are also formed so that their thickness T2 becomes less than that of the plus busbars 132*b*, 132*d*, and 132*f* and the coupling part 132*g*. Thus, increases in the weight and the manufacturing cost can be suppressed, while lowering the inductance, compared with a case where the thickness T2 of the terminal joining part 134*a* and the extended part 134*b* of the cathode plate-shaped busbar 134 is equal to or more than that of the plus busbars 132*b*, 132*d*, and 132*f* and the coupling part 132*g*.

Further, in the power converter 100, the plus busbars 132*b*, 132*d*, and 132*f* are formed so that the thickness T6 becomes greater than that of the terminal joining part 134*a* and the extended part 134*b* of the cathode plate-shaped busbar 134. Thus, by securing a greater cross-sectional area compared with a case where the thickness T6 of the plus busbars 132*b*, 132*d*, and 132*f* is equal to or less than that of the terminal joining part 134*a* and the extended part 134*b* of the cathode plate-shaped busbar 134, it can suppress the decrease in the rigidity, and the decrease in the durability due to the temperature rise in the connecting part with the cathode power module terminals 144*b*, 144*d* and 144*f*, and its vicinities.

Further, the power converter 100 according to the above embodiment, since the coupling part 132*g* (with the thickness T4) thicker than that the terminal joining part 134*a* and the extended part 134*b* of the cathode plate-shaped busbar 134 is joined to the extended part 134*b* of the cathode plate-shaped busbar 134, the rigidity of the extended part 134*b* of the cathode plate-shaped busbar 134 is also reinforced by the joining of the coupling part 132*g*. Therefore, in the power converter 100, the high rigidity of the cathode plate-shaped busbar 134, the coupling part 132*g*, and the plus busbars 132*b* 132*d*, and 132*f* can be secured, while lowering the inductance and suppressing the increases in the weight and the manufacturing cost.

Further, in the power converter 100, as illustrated in FIG. 10, the extended part 135*b* of the anode plate-shaped busbar 135 and the extended part 134*b* of the cathode plate-shaped busbar 134 are overlapped with each other in the non-contacting fashion. Thus, the strength at the part where the extended parts 134*b* and 135*b* are overlapped with each other can be increased, compared with a case where the extended part 135b of the anode plate-shaped busbar 135 and the extended part 134b of the cathode plate-shaped busbar 134 are disposed separately.

Parasitic capacitance occurs at the part where the extended part 135b of the anode plate-shaped busbar 135 and the extended part 134b of the cathode plate-shaped busbar 134 are overlapped with each other in the non-contacting fashion. Therefore, in the power converter 100, high-frequency noise that occurs in the power module part 140 can be fed back to the power module part 140 side by the smoothing part 130, and therefore, it is advantageous for suppressing that the high-frequency noise leaks to the DC circuit.

Further, minute parasitic inductance also exists in the busbars on the power module part 140 side (the extended parts 134b and 135b, the plus busbars 132b, 132d, and 132f, and the minus busbars 132a, 132c, and 132e) of the smoothing capacitors 133. Since a rapid current variation during the turn-off of the power module part 140 is transmitted to the parasitic inductance on the power module part 140 side of the smoothing capacitors 133, without being smoothed by the smoothing capacitors 133, it becomes a major factor of a surge voltage during the turn-off of the power module. Therefore, the parasitic inductance on the power module part 140 side of the smoothing capacitors 133 can be reduced by the above-described parasitic capacitance, and the surge voltage can be suppressed, in addition to the inductance reduction by widening the cathode plate-shaped busbar 134 and the anode plate-shaped busbar 135.

Further, in the power converter 100, since the noise removing part 120 including the ferrite core is disposed between the smoothing part 130 and the DC connector part 110 in the electric power circulation path, it is more advantageous for suppressing that the high-frequency noise occurred in the power module part 140 leaks to the external DC circuit from the DC connector part 110.

As described above, in the power converter 100 according to this embodiment, it is possible to suppress that the high-frequency noise occurred in the power module part 140 leaks to the DC circuit, suppress the increases in the weight and the manufacturing cost, and realize the high durability.

Modifications

Although in the above embodiment the thickness T2 of the terminal joining part 134a and the extended part 134b of the cathode plate-shaped busbar 134 is less than that of the plus busbars 132b, 132d, and 132f and the coupling part 132g, and the thickness T1 of the terminal joining part 135a and the extended part 135b of the anode plate-shaped busbar 135 is less than that of the minus busbars 132a, 132c, and 132e and the coupling part 132h, the present disclosure is not limited to this configuration. For example, only the thickness T2 of the terminal joining part 134a and the extended part 134b of the cathode plate-shaped busbar 134 may be less than that of the plus busbars 132b, 132d, and 132f and the coupling part 132g, or only the thickness T1 of the terminal joining part 135a and the extended part 135b of the anode plate-shaped busbar 135 may be less than that of the minus busbars 132a, 132c, and 132e and the coupling part 132h.

Further, although in the above embodiment the plus busbars 132b, 132d, and 132f are configured to be integral with the coupling part 132g, and the minus busbars 132a, 132c, and 132e are configured to be integral with the coupling part 132h, the present disclosure is not limited to this configuration. For example, the plus busbars 132b, 132d, and 132f may be joined to the coupling part 132g, or the minus busbars 132a, 132c, and 132e may be joined to the coupling part 132h.

Further, although in the above embodiment the terminal joining part 134a of the cathode plate-shaped busbar 134 is disposed above the smoothing capacitors 133, and the terminal joining part 135a of the anode plate-shaped busbar 135 is disposed below the smoothing capacitors 133, the present disclosure is not limited to this configuration. For example, the terminal joining part 134a of the cathode plate-shaped busbar 134 may be disposed below the smoothing capacitors 133, and the terminal joining part 135a of the anode plate-shaped busbar 135 may be disposed above the smoothing capacitors 133. Alternatively, the smoothing capacitors 133 may be disposed so that the cathode-side terminals 1333 of the smoothing capacitors 133 are disposed to either one of the right side and the left side and the anode-side terminals 1334 are disposed to the other side. Further, the terminal joining part 134a of the cathode plate-shaped busbar 134 may be disposed to the one side of the smoothing capacitors 133, and the terminal joining part 135a of the anode plate-shaped busbar 135 may be disposed to the other side of the smoothing capacitors 133.

Further, although in the above embodiment the Y capacitor 138 is adopted as one example of an additional constituent member, the smoothing part 130 in the present disclosure may be provided with other constituent members (e.g., a resistance and a coil) other than the Y capacitor. Also in this case, similarly to the above embodiment, at least one of the cathode plate-shaped busbar 134 and the anode plate-shaped busbar 135 may be disposed so as to be offset to one of the right side and the left side, and a part of a connection part may project outwardly from the side edge of the offset plate-shaped busbar.

Further, although in the above embodiment the refrigerant passage 102a is provided below the smoothing part 130 in the case body 102, the present disclosure is not limited in the formed position of the refrigerant passage 102a. For example, the refrigerant passage 102a may be provided to the side wall of the case body 102, or may be provided to the lid 103.

Further, although in the above embodiment the inverter device is adopted as one example of the power converter 100, the present disclosure is not limited to this configuration. For example, the present disclosure may also be applied to a DC-DC converter.

Further, although in the above embodiment the power converter 100 mounted on the vehicle V is used as one example, the present disclosure may also be applied to a power converter used for industrial machinery. Further, as the vehicle, not only the hybrid electric vehicle (HEV) but also a battery electric vehicle (BEV) which is not provided with an engine as a driving source for propelling the vehicle may be adopted.

Further, although in the above embodiment the resin mold part 136 is provided outside the smoothing part 130, the smoothing part does not need to be provided with the resin mold part in the present disclosure.

It should be understood that the embodiments herein are illustrative and not restrictive, since the scope of the invention is defined by the appended claims rather than by the description preceding them, and all changes that fall within metes and bounds of the claims, or equivalence of such metes and bounds thereof, are therefore intended to be embraced by the claims.

17

DESCRIPTION OF REFERENCE CHARACTERS

100 Power Converter
102a Refrigerant Passage (Cooling Part)
130 Smoothing Part
133 Smoothing Capacitor
132a, 132c, 132e Minus Busbar (Connection Piece Part of Second Busbar)
132b, 132d, 132f Plus Busbar (Connection Piece Part of Fourth Busbar)
132g Coupling Part (Base Part of Fourth Busbar)
132h Coupling Part (Base Part of Second Busbar)
134 Cathode Plate-shaped Busbar (Third Busbar)
135 Anode Plate-shaped Busbar (First Busbar)
135c Side Edge
137 Partition Member
138 Y Capacitor (Additional Constituent Member)
140 Power Module Part
143 IGBT (Power Module)
144a, 144c, 144e Anode Power Module Terminal
144b, 144d, 144f Cathode Power Module Terminal
1333 Cathode-side Terminal
1334 Anode-side Terminal
What is claimed is:

1. A power converter, comprising:
a power module part having a plurality of power modules arrayed in a first direction; and
a smoothing part disposed so as to be adjacent to the power module part on a first side in a second direction that intersects with the first direction and to electrically intervene between the power module part and a direct-current circuit, the smoothing part including a smoothing capacitor, a cathode-side connection busbar, and an anode-side connection busbar, the smoothing capacitor having a cathode-side terminal and an anode-side terminal, the cathode-side connection busbar connecting the cathode-side terminal and the power module part, and the anode-side connection busbar connecting the anode-side terminal and the power module part,
wherein a first connection busbar, which is one of the cathode-side connection busbar and the anode-side connection busbar, has a plate-shaped first busbar and a second busbar, the first busbar connected to a first terminal, which is one of the cathode-side terminal and the anode-side terminal, the first terminal corresponding in polarity to the first connection busbar, and the second busbar connecting the first busbar and the power module part,
wherein the first busbar has a terminal joining part and an extended part, the terminal joining part being disposed along the corresponding polarity terminal, and the extended part being disposed along a side surface of the smoothing capacitor so that the extended part extends continuously to the terminal joining part and extends toward a power module part side of the power converter,
wherein the second busbar has a base part extending in the first direction and joined to a surface of the extended part of the first busbar on the power module part side, and a connection piece part extending toward the power module part side from the base part and connecting between the base part and a power module terminal of the power module part, and
wherein the terminal joining part and the extended part of the first busbar are formed so as to have a width in the first direction that is greater than a width of the connection piece part of the second busbar, and a thickness that is less than a thickness of the base part and the connection piece part of the second busbar.
2. The power converter of claim 1,
wherein the smoothing part further has an additional constituent member different from the smoothing capacitor, the cathode-side connection busbar, and the anode-side connection busbar, the additional constituent member being disposed adjacent to the first busbar on a first side in the first direction,
wherein the terminal joining part and the extended part in the first busbar are disposed so as to be offset toward a second side in the first direction to avoid the additional constituent member, and
wherein the base part of the second busbar is disposed so as to project toward the first side in the first direction with respect to a side edge of the first busbar on the first side in the first direction.
3. The power converter of claim 2,
wherein a second connection busbar, which is the other of the cathode-side connection busbar and the anode-side connection busbar, includes:
a plate-shaped third busbar connected to a second terminal, which is the other of the cathode-side terminal and the anode-side terminal, the second terminal corresponding in polarity to the second connection busbar, the third busbar having a terminal joining part disposed along the second terminal, and an extended part disposed along a side surface of the smoothing capacitor so that the extended part extends continuously to the terminal joining part and extends toward the power module part side; and
a fourth busbar connecting the extended part of the third busbar and the power module part, the fourth busbar having a base part extending in the first direction and joined to a surface of the extended part on the power module part side, and a connection piece part extending toward the power module part side from the base part and connecting between the base part and a power module terminal of the power module part, and
wherein the terminal joining part and the extended part of the third busbar are formed so as to have a width in the first direction that is greater than a width of the connection piece part of the fourth busbar, and a thickness that is less than a thickness of the base part and the connection piece part of the fourth busbar.
4. The power converter of claim 3, wherein the extended part of the first busbar and the extended part of the third busbar are overlapped with each other in a non-contacting fashion.
5. The power converter of claim 2, further comprising a noise removing part disposed between the smoothing part and the direct-current circuit in an electric power circulation path, and comprised of a ferrite core.
6. The power converter of claim 1,
wherein a direction intersecting both the first direction and the second direction is a third direction,
wherein the extended part of the first busbar extends toward a first side in the third direction from an end edge part of the terminal joining part on the power module part side,
wherein the power converter is further provided with a cooling part thermally coupled with the first busbar in the smoothing part and disposed on a second side in the third direction to the terminal joining part of the first busbar, and wherein the base part of the second busbar is connected to the connection piece part at the end edge part on the first side in the third direction.

7. The power converter of claim 6, wherein a second connection busbar, which is the other of the cathode-side connection busbar and the anode-side connection busbar, includes:

a plate-shaped third busbar connected to a second terminal, which is the other of the cathode-side terminal and the anode-side terminal, the second terminal corresponding in polarity to the second connection busbar, the third busbar having a terminal joining part disposed along the second terminal, and an extended part disposed along a side surface of the smoothing capacitor so that the extended part extends continuously to the terminal joining part and extends toward the power module part side; and a fourth busbar connecting the extended part of the third busbar and the power module part, the fourth busbar having a base part extending in the first direction and joined to a surface of the extended part on the power module part side, and a connection piece part extending toward the power module part side from the base part and connecting between the base part and a power module terminal of the power module part, and wherein the terminal joining part and the extended part of the third busbar are formed so as to have a width in the first direction that is greater than a width of the connection piece part of the fourth busbar, and a thickness that is less than a thickness of the base part and the connection piece part of the fourth busbar.

8. The power converter of claim 7, wherein the extended part of the first busbar and the extended part of the third busbar are overlapped with each other in a non-contacting fashion.

9. The power converter of claim 6, further comprising a noise removing part disposed between the smoothing part and the direct-current circuit in an electric power circulation path, and comprised of a ferrite core.

10. The power converter of claim 1, wherein a second connection busbar, which is the other of the cathode-side connection busbar and the anode-side connection busbar, includes:

a plate-shaped third busbar connected to a second terminal, which is the other of the cathode-side terminal and the anode-side terminal, the second terminal corresponding in polarity to the second connection busbar, the third busbar having a terminal joining part disposed along the second terminal, and an extended part disposed along a side surface of the smoothing capacitor so that the extended part extends continuously to the terminal joining part and extends toward the power module part side; and a fourth busbar connecting the extended part of the third busbar and the power module part, the fourth busbar having a base part extending in the first direction and joined to a surface of the extended part on the power module part side, and a connection piece part extending toward the power module part side from the base part and connecting between the base part and a power module terminal of the power module part, and wherein the terminal joining part and the extended part of the third busbar are formed so as to have a width in the first direction that is greater than a width of the connection piece part of the fourth busbar, and a thickness that is less than a thickness of the base part and the connection piece part of the fourth busbar.

11. The power converter of claim 10, wherein the extended part of the first busbar and the extended part of the third busbar are overlapped with each other in a non-contacting fashion.

12. The power converter of claim 1, further comprising a noise removing part disposed between the smoothing part and the direct-current circuit in an electric power circulation path, and comprised of a ferrite core.

* * * * *